United States Patent [19]
Sato

[11] Patent Number: 5,734,662
[45] Date of Patent: Mar. 31, 1998

[54] PERIOD GENERATING DEVICE

[75] Inventor: Shinya Sato, Ohra-gun, Japan

[73] Assignee: Advantest Corporation, Tokyo, Japan

[21] Appl. No.: 849,145

[22] PCT Filed: Sep. 27, 1996

[86] PCT No.: PCT/JP96/02825

§ 371 Date: May 29, 1997

§ 102(e) Date: May 29, 1997

[87] PCT Pub. No.: WO97/12255

PCT Pub. Date: Apr. 3, 1997

[30] Foreign Application Priority Data

Sep. 29, 1995 [JP] Japan .................... 7-253349

[51] Int. Cl.$^6$ ............................................ G06F 11/00
[52] U.S. Cl. .............................................. 371/27.7
[58] Field of Search .................... 371/27.7, 21.1, 371/21.6, 22.7, 22.5, 22.6, 27.5

[56] References Cited

FOREIGN PATENT DOCUMENTS 62-49272 3/1987 Japan .
4-98419 3/1992 Japan .
4-109183 4/1992 Japan .

*Primary Examiner*—Vincent P. Canney
*Attorney, Agent, or Firm*—Staas & Halsey

[57] ABSTRACT

The present invention makes it possible that a period generating device required to operate at high rate can be implemented as an IC of a CMOS structure. Shift registers each operating as a pipeline are provided at the previous stage and the subsequent stage to a period memory for storing period data, respectively. Each shift register is constituted by a plurality of flip-flops, and a switching circuit is provided at the previous stage to each of the flip-flops. The switching circuits are controlled to provide a cascade connection of the flip-flops to perform a shift operation in response to a reference clock applied to the trigger terminals of the flip-flops only during the time interval that coincidence detecting means outputs a coincidence signal, which detects a coincidence between a period data and an output from a counter for counting the reference clock. As a result, when the coincidence detecting means does not output the coincidence signal, each shift register maintains data stored therein, whereas when the coincidence signal is outputted, each shift register performs a shift operation reliably in response to the reference clock.

4 Claims, 9 Drawing Sheets

PERIOD GENERATING DEVICE

TECHNICAL FIELD

The present invention relates to a period generating device which is used in a semiconductor device testing apparatus (commonly called IC tester) for testing a semiconductor device, particularly, a semiconductor integrated circuit element (hereinafter referred to as IC) which is a typical example of the semiconductor devices, and generates a pulse signal having a test period which is previously set, that is, a pulse having a period with which a test pattern is generated.

BACKGROUND ART

First, a semiconductor device testing apparatus (hereafter referred to as IC tester) in which a period generating device of this type is used will be briefly described with reference to FIG. 4 which shows a general arrangement of a conventional IC tester. The IC tester, generally designated by reference numeral 1, comprises, roughly speaking, a timing generator (TMG GEN) 2 for generating various kinds of timing signals, a pattern generator (PTN GEN) 3 supplied from the timing generator 2 with a timing signal (TMG SIG), that is, a period signal (PRD SIG) defining the period with which a test pattern is generated and for generating a predetermined test pattern data (TEST PTN DATA) in accordance with the period signal, a waveform generator (WAVE GEN) 4 for generating a test pattern signal (TEST PTN SIG) having real waveforms required to test an IC 6 to be tested based on the test pattern data supplied from the pattern generator 3, and a logical comparator (LG COMPA) 5 to which a response output signal (RPS OUT SIG) from the IC 6 to be tested and an expected pattern data (EP PTN DATA) generated from the pattern generator 3 are supplied.

A response output signal outputted from the IC 6 to be tested in response to a test pattern signal applied from the waveform generator 4 is inputted to the logical comparator 5 wherein it is logically compared with an expected value pattern data outputted from the pattern generator 3. When the response output signal does not coincide with the expected value pattern data, the logical comparator 5 generates a signal indicating that there is an anti-coincidence therebetween so that a decision is rendered that the IC to be tested contains a defective portion (failure) or portions.

The period of a period signal outputted from the timing generator 2 is defined by timing set data (TMG SET DATA) TS which is fed from the pattern generator 3 to the timing generator 2. That is, the timing generator 2 outputs a period signal the period of which is defined depending upon the timing set data TS outputted from the pattern generator 3, and the pattern generator 3 outputs test pattern data in accordance with the period of that period signal.

A general arrangement of a conventional period generating device which defines the period of a period signal will now be described with reference to FIG. 5. As shown in FIG. 5, a period generating device 10 is provided within the timing generator 2, and may comprise a period memory (PRD MEM) 11 in which period data are previously stored, a counter (CTR) 12 for counting a reference clock (REF CLK) PC used in the period generating device 10, and coincidence detecting means 13 for outputting a coincidence detection signal J when a count value of the counter 12 coincides with period data outputted from the period memory 11.

The timing set data TS outputted from the pattern generator 3 is inputted to an address terminal of the period memory 11 thereby reading out of the period memory 11 period data corresponding to respective timing set data TS. A period data which is read out of the period memory 11 corresponds to the number of reference clocks PC. For example, if the reference clock PC has a frequency of 100 MHz, one period of the reference clock is equal to 10 nanoseconds (nsec). Accordingly, when a period data read out of the period memory 11 in response to the inputted timing set data TS is equal to, for example, "2" (which indicates that the number of the reference clocks is equal to 2), the outputted period signal has a period of 2×10 (=20) nsec. In such manner, a numerical value of the period data read out of the period memory 11 is converted into a period (time).

In the example shown in FIG. 5, the period generating device 10 is so arranged that a part of the coincidence detection signal J outputted from the coincidence detecting means 13 is fed through an OR circuit 14 to a load input terminal LD of the counter 12. Accordingly, the counter 12 is initialized each time the coincidence detecting means 13 outputs a coincidence detection signal J, and the initialization and the detection of coincidence are repeated so that the coincidence detection signal J shown in FIG. 6D is outputted as a period signal.

The operation of the period generating device 10 begins with an input of a period generation start signal (PRD GEN START SIG) to the other input of the OR circuit 14. The period generation start signal is a signal obtained by detecting a rise (leading edge) of a period generation signal supplied from the pattern generator 3. Normally, a period generating operation is performed when the period generation signal assumes "H (high logical level)", and hence the rise of this "H" signal is detected. When the period generating operation is started, the counter 12 which operates in accordance with the reference clock PC used in the period generating device 10 is set to "1" (initialized state), and counts up in synchronism with the reference clock PC. A coincidence between a count in the counter 12 and period data outputted from the period memory 11 is detected by the coincidence detecting means 13, and the detected coincidence signal serves as a period signal as described above. Assuming that the period data is "2" as mentioned above, the coincidence of the count with the period data is detected each time the count in the counter 12 reaches 2. Consequently, the period of a period signal generated has a length in time corresponding to the sum of 2 pulses in the reference clock signal. When the reference clock signal PC has a frequency of 100 MHz, the period is equal to 2×10 (=20) nsec as discussed above.

While not shown, an AND of the period signal and the reference clock is taken in an AND circuit the output of which serves as a period clock LT shown in FIG. 6E. As described above, each time the coincidence signal is outputted, the counter 12 is set to "1" (which corresponds to that the number of the reference clock is equal to 1), or is initialized, and subsequently the same operation is repeated.

It will be noted that the construction of the period generating device 10 is shown in a simplified manner in FIG. 5 in order to explain a mechanism of generating a period clock LT. However, in actuality, the period clock LT must be generated at high rate or speed. Therefore, it is impossible to achieve a high rate operation by the above-mentioned circuit arrangement that the timing set data TS is read out of the pattern generator 2. For this reason, in the prior art is used such an arrangement as shown in FIG. 7 that two shift registers 18 and 19, each comprising a series of flip-flops which operate as a pipeline, are provided at the previous stage and the subsequent stage to the period memory 11, respectively, and each of the stages (flip-flops) of the previous stage shift register 18 has timing set data TS previously stored therein. With such arrangement, each time the coincidence signal J is outputted, the both shift registers 18 and 19 are driven so that the timing set data TS and the period data are shifted one stage (one flip-flop) by one stage, which enables a quick-access to the period memory 11 as well as enables the read-out output, namely, the period data to supply to the coincidence detecting means 13 at high rate or speed.

In case the period generating device 10 is manufactured in the form of integrated circuit (IC), to construct the circuit arrangement of the IC in the form of a CMOS (complementary MOS) structure makes manufacture thereof very easy, which results in an additional advantage that the power consumption can be reduced. Consequently, it is a common practice to manufacture the period generating device as an IC in a CMOS structure.

It will be noted from FIG. 6D that the coincidence signal J is much different in phase from the reference clock PC. For this reason, an erroneous operation is caused if the coincidence signal J is used to drive the shift registers 18 and 19. Accordingly, it is generally required to generate a period clock which is in phase with the reference clock PC by stamping out the interval during which the coincidence signal J is generated with the reference clock PC, that is, by taking an AND of the coincidence signal and a reference clock which is first inputted to the period generating device during the coincidence signal is generating.

In the example shown in FIG. 7, re-timing means 15 comprising an AND gate is provided on the output side of the coincidence detecting means 13. This re-timing means 15 takes an AND of the coincidence signal J and a reference clock PC which is first inputted to the period generating device during the coincidence signal J is generating, and generates a period clock LT shown in FIG. 6E which is synchronized with the reference clock PC. The period clock LT is fed to the shift registers 18 and 19 to drive and shift them in synchronism with the reference clock PC.

A miniaturization and a reduction in the power consumption of an apparatus are also demanded in the field of IC testers. To accommodate such demand, an attempt is made to manufacture an apparatus by forming circuits of various portions of the apparatus as an IC. In case the period generating device 10 is to be manufactured as an IC, there is caused, particularly, in the re-timing means 15 a trouble that it is difficult to match the phase of the reference clock PC to a timing at the center portion in the interval of the coincidence signal J during which the coincidence signal J is generated. The reason is that though it is normal that an IC is formed in a CMOS structure, an IC of CMOS structure gives an increased time delay to a signal propagating through a circuit element in the IC due to the circuit construction of the CMOS structure itself. As a result, there is a disadvantage that time delay adjusting means is not available which can be used in the re-timing means 15 to match the phase of the reference clock PC to substantially the center of the interval during which the coincidence signal J is generated.

For example, it is assumed that in a period generating device constructed by circuits of CMOS structure, a delay element 16 is inserted into one signal path to the re-timing means 15 on which the coincidence signal J is inputted as shown in FIG. 8. In such case, even if circuit elements (inverters, OR gates, and the like) are used which give the minimum time delay to a signal propagating through the circuit elements, a time delay caused by such circuit elements will be equal to or greater than 10 nsec ($10 \times 10^{-9}$ sec). Assuming that the reference clock PC has a frequency of 100 MHz for instance, one period of the reference clock PC is equal to 10 nsec as previously discussed. Accordingly, if a time delay $\tau_1$ of 10 nsec is given to the delay element 16, the coincidence signal J will be supplied to the re-timing means 15 delayed by a time delay corresponding to one period (10 nsec) of the reference clock PC. If the time delay $\tau_1$ of the delay element 16 should increase beyond 10 nsec even slightly, the relationship between the coincidence signal outputted from the coincidence detecting means 13 and the reference clock PC in the input side of the re-timing means 15 will become a bad condition in which the central portion of the coincidence signal J cannot be stamped out with a reference clock PC, i.e., an AND of the reference clock PC and the coincidence signal J cannot be taken at the central portion of the coincidence signal J as shown in FIG. 9B. Thus, if the time delay $\tau_1$ of the delay element 16 exceeds one period T of the reference clock PC, the re-timing means 15 outputs two period signals LT and LT' as shown in FIG. 9C, and consequently, there is caused a disadvantage that the shift registers 18 and 19 will perform their shift operations twice, or alternatively, the pulse width of the period signal LT will be narrowed, resulting in a failure to provide reliable shift operations of the shift registers 18 and 19.

Accordingly, it may be contemplated to eliminate the delay element 16. However, in case the delay element 16 is eliminated, the delay time of the coincidence signal J comes to be shorter than the pulse width of the reference clock PC. In this case, there is again caused a disadvantage that two period signals LT and LT' are produced as illustrated in FIG. 10.

Alternatively, a method may be contemplated, which utilizes a latch circuit 17 in place of the delay element 16 as shown in FIG. 11. However, in case the counter 12, the coincidence detecting means 13 and the latch circuit 17 are manufactured in the form of a CMOS structure, it is very difficult to complete the operations of these circuit elements within a time duration of 5 nsec corresponding to half of the period, namely, the pulse width of the reference clock PC. In order to assure the normal operations thereof by the method utilizing the latch circuit 17, there is no means but to make longer the period of the reference clock PC. However, if the period of the reference clock PC is prolonged, the period with which the period clock LT is generated will increase, resulting in a disadvantage that the period resolution or the resolution of the period is deteriorated and hence the set resolution of the test period for ICs is lowered.

DISCLOSURE OF THE INVENTION

It is an object of the present invention to provide a period generating device which operates in a stable manner without making longer the period of reference clock even if the period generating device is formed as an IC in the form of a CMOS structure.

In accordance with the present invention, a reference clock PC is directly supplied to a trigger input terminal of each of flip-flops which constitute a shift register provided at the previous stage to a period memory, and a switching circuit is provided at the previous stage to each flip-flop. The switching circuits are controlled to be switched in accordance with the presence or absence of a coincidence signal J such that when the coincidence signal J is not outputted, an output of each flip-flop is fed back to its own input terminal, whereas when the coincidence signal J is outputted, an output of the preceding stage flip-flop is transferred to the input terminal of the immediately subsequent stage flip-flop, and the individual flip-flops are operated in synchronism with the reference clock.

With the above arrangement of the present invention, it is only required that a time interval within which the counter 12, the coincidence detecting means 13 and the latch circuit 17 complete their operations is shorter than a time interval corresponding to one period of the reference clock. Accordingly, as compared with a conventional arrangement in which the operations thereof must be completed within a time interval corresponding to a half-period of the reference clock PC, the allowable limits of time is doubled. Thus, a period generating device which is manufactured as an IC in the form of a CMOS structure can be realized.

BEST MODE FOR CARRYING OUT THE INVENTION

Figure 1:
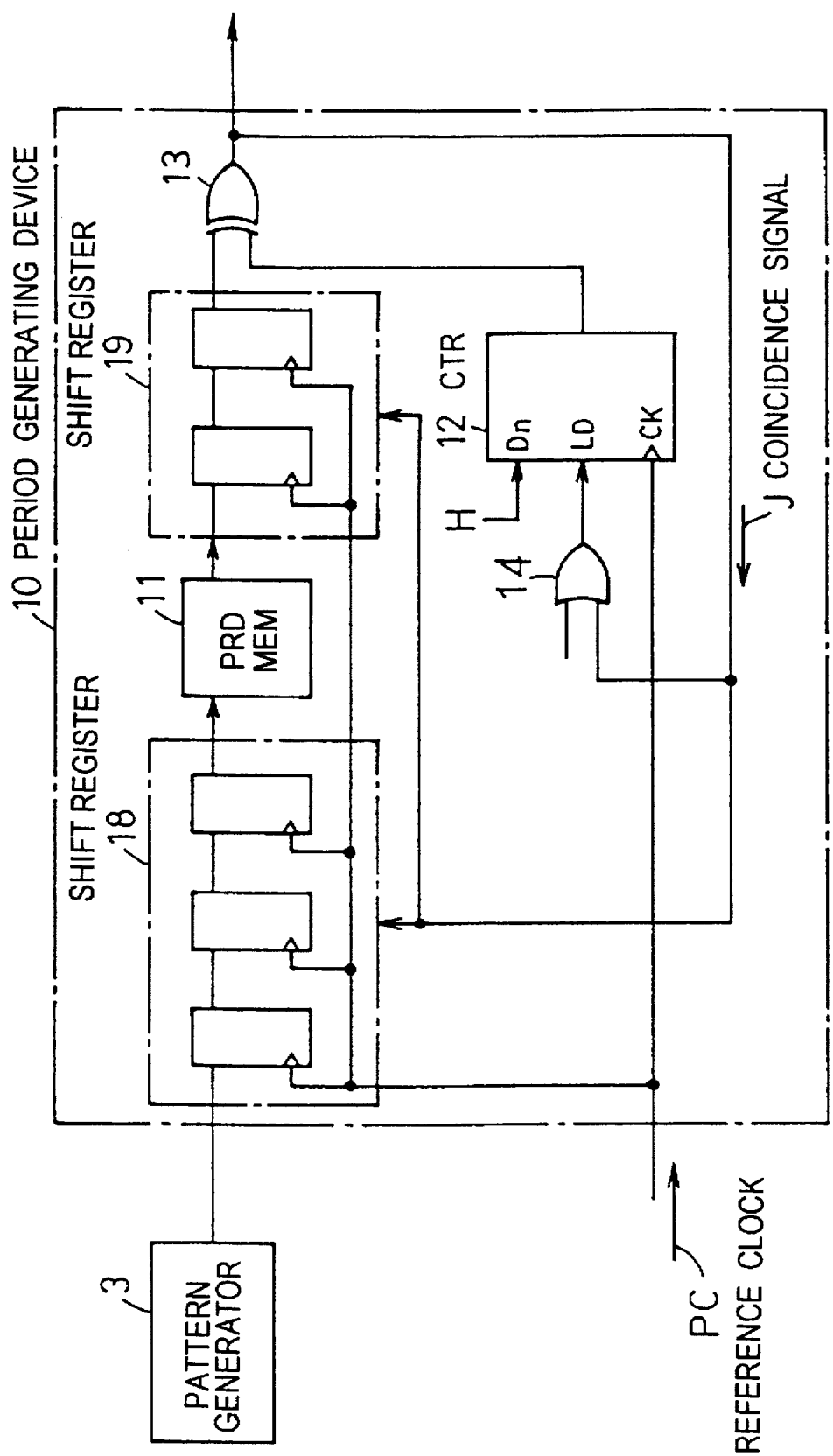
FIG. 1 is a block diagram showing a general construction of an embodiment of the period generating device according to the present invention.
Figure 2:
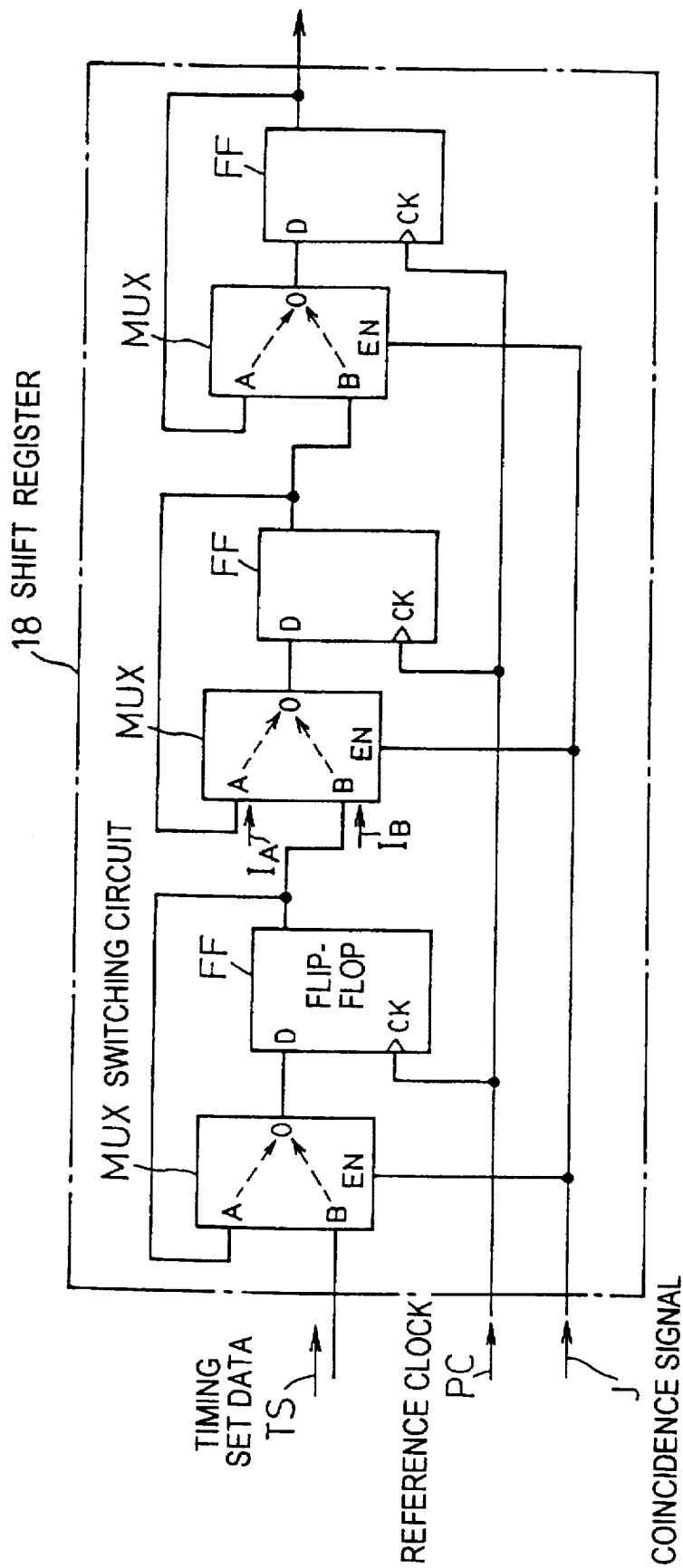
FIG. 2 is a block diagram showing the detailed construction of a shift register used in the embodiment shown in FIG. 1.

A period generating device according to an embodiment of the present invention will now be described in detail with reference to the drawings. FIG. 1 shows a general construction of an embodiment of the period generating device according to the present invention, and FIG. 2 is a block diagram showing a detailed construction of a shift register used in the embodiment shown in FIG. 1. In this embodiment, a switching circuit MUX is provided at the previous stage to each of flip-flops FF constituting a shift register 18 and at the previous stage to each of flip-flops FF constituting a shift register 19, as shown in FIG. 2. The shift register 18 operates as a pipeline and is provided at the previous stage to a period memory 11 which stores period data therein, and the shift register 19 also operates as a pipeline and is provided at the subsequent stage to the period memory 11. While only the previous stage shift register 18 is shown in FIG. 2, it should be understood that the subsequent stage shift register 19 is also arranged in a similar circuit construction.

Each switching circuit MUX has an input terminal A to which an output signal IA of an associated flip-flop FF at the immediately subsequent stage is supplied, and to another input terminal B of each switching circuit MUX is supplied an output signal IB of an associated flip-flop at the immediately previous stage. Each switching circuit MUX has a control terminal EN to which a coincidence signal J outputted from coincidence detecting means 13 is supplied. An output terminal O of each switching circuit MUX is connected to an input terminal D of an associated flip-flop FF at the immediately subsequent stage. In addition, a reference clock PC in the period generating device is inputted to a trigger input terminal CK of each flip-flop FF.

Each of the switching circuits MUX is switched such that its input terminal A is connected to its output terminal O when the coincidence signal J applied to the control terminal EN assumes a logic "L" (low level) and the input terminal B is connected to the output terminal O when the coincident signal J assumes a logic "H" (high level). Accordingly, when the coincidence detecting means 13 does not detect a coincidence, the input terminal A of each of the switching circuits MUX is connected to its output terminal O. Under this condition, each flip-flop FF reads therein its own output even if a reference clock PC is inputted to its trigger input terminal CK. Consequently, the timing set data TS stored in each flip-flop FF and period data read out of the period memory 11 are not shifted through the shift registers 18 and 19, respectively.

On the other hand, when the coincidence detecting means 13 detects a coincidence and outputs a logic "H" level, each switching circuit MUX is switched to a condition in which the input terminal B is connected to the output terminal O. Under this condition, when a reference clock PC is inputted to the trigger input terminal CK of each flip-flop FF, each flip-flop FF reads therein an output of the immediately preceding stage flip-flop thereto at a timing of the rise or leading edge of the reference clock PC. As a result, the timing set data TS and the period data read out of the period memory 11 are shifted one stage by one stage through the flip-flops of the corresponding shift registers 18 and 19, respectively, thereby updating the status of the period data outputted from the shift register 19 and inputted to the coincidence detecting means 13.

Figure 3:
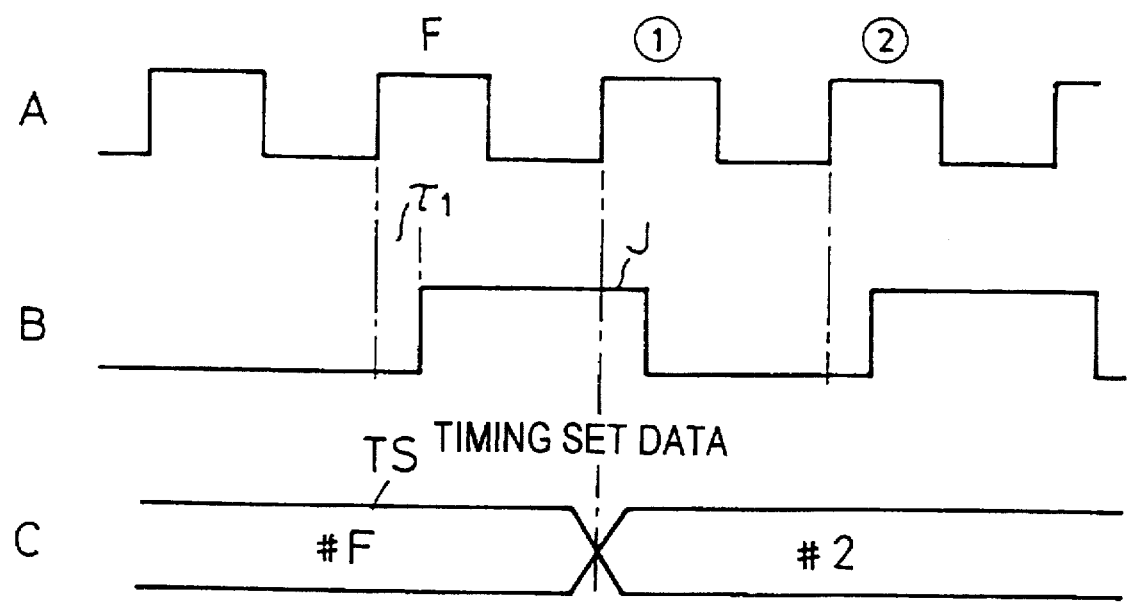
FIG. 3 is waveforms for explaining the operation of the shift register shown in FIG. 2.
Figure 4:
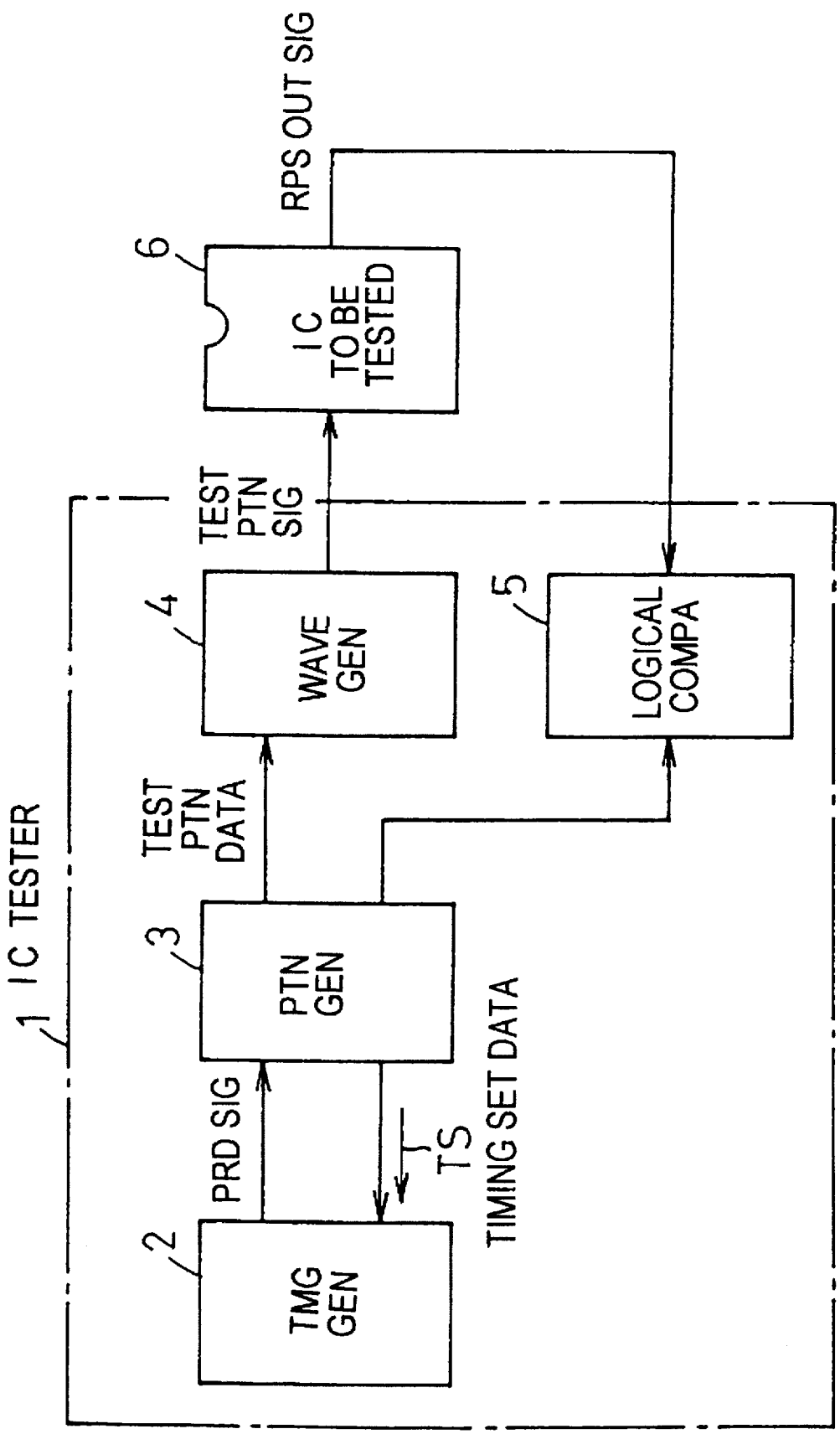
FIG. 4 is a block diagram showing a general construction of an example of the conventional IC tester.
Figure 5:
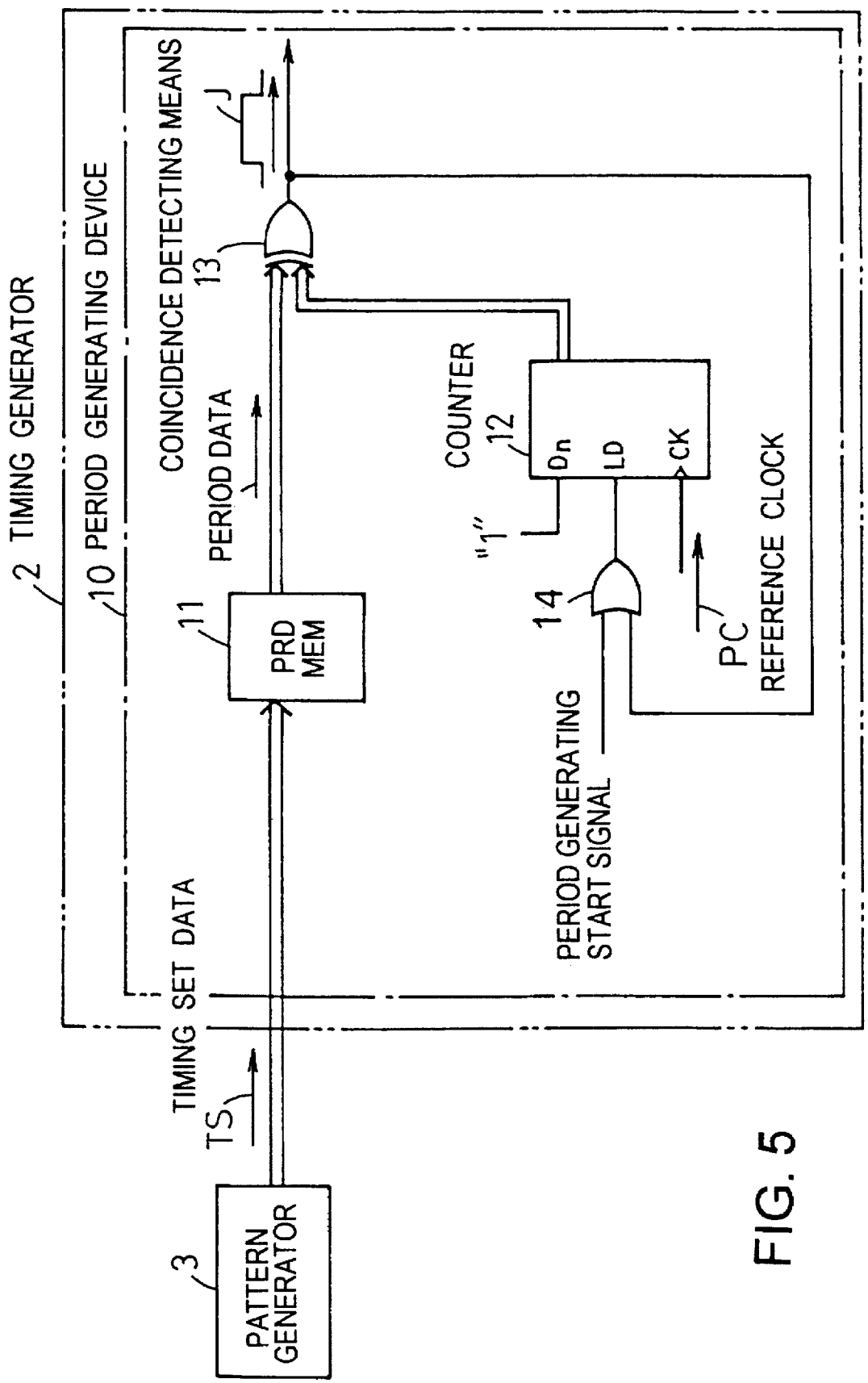
FIG. 5 is a block diagram showing a general construction of an example of the period generating device used in a conventional IC tester.
Figure 6:
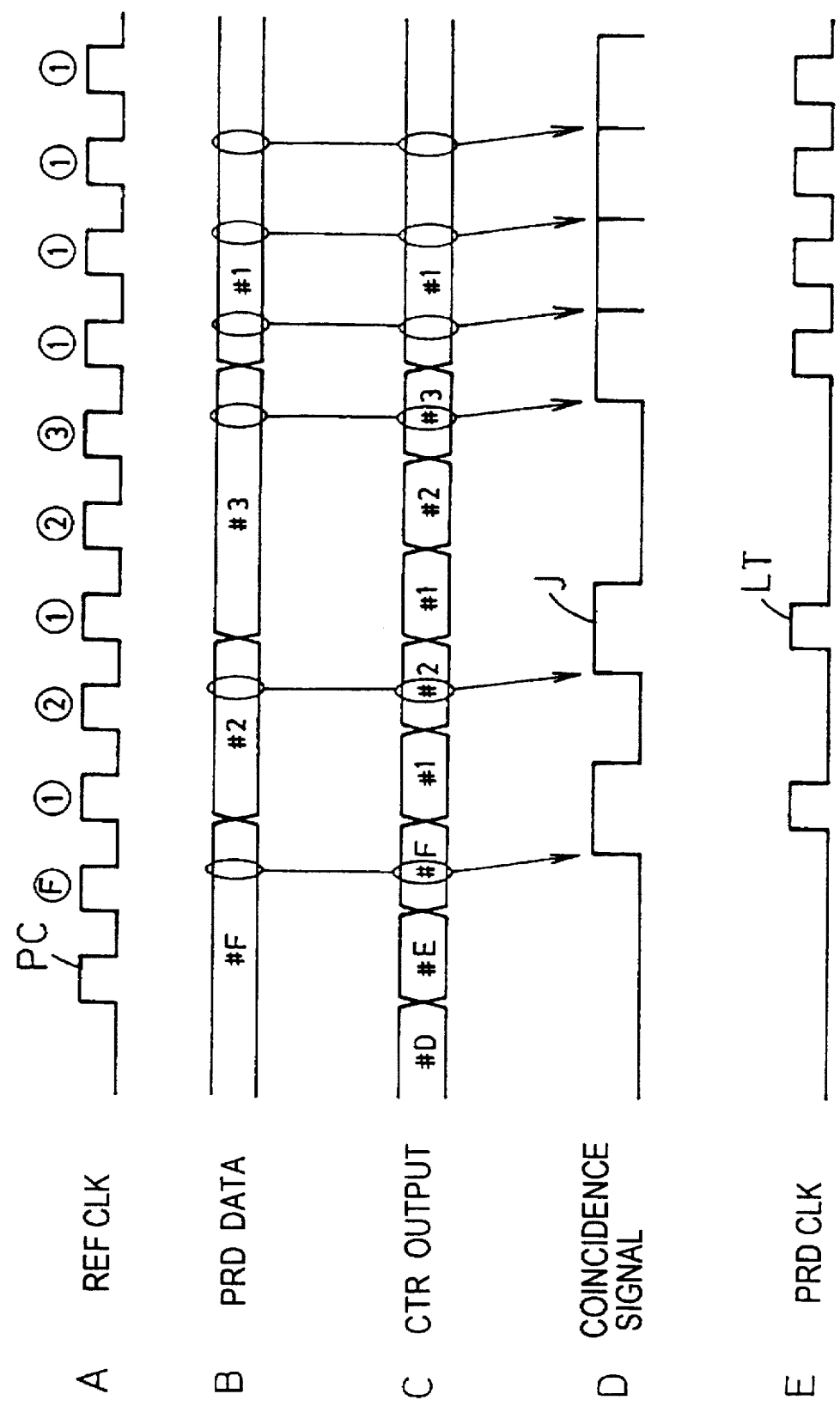
FIG. 6 is waveforms for explaining the operation of the period generating device shown in FIG. 5.
Figure 7:
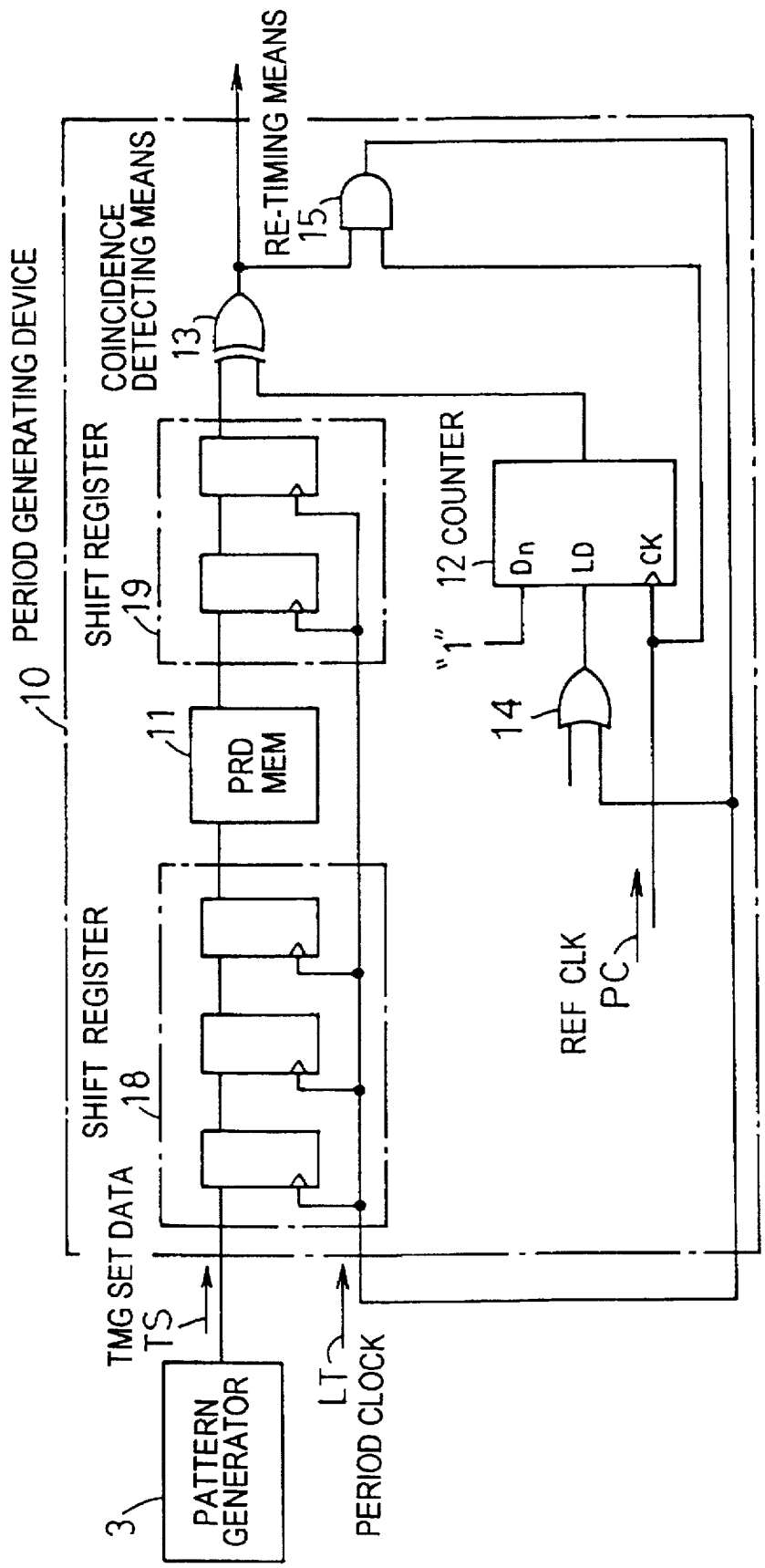
FIG. 7 is a block diagram showing an example of the conventional period generating device provided with re-timing means.
Figure 8:
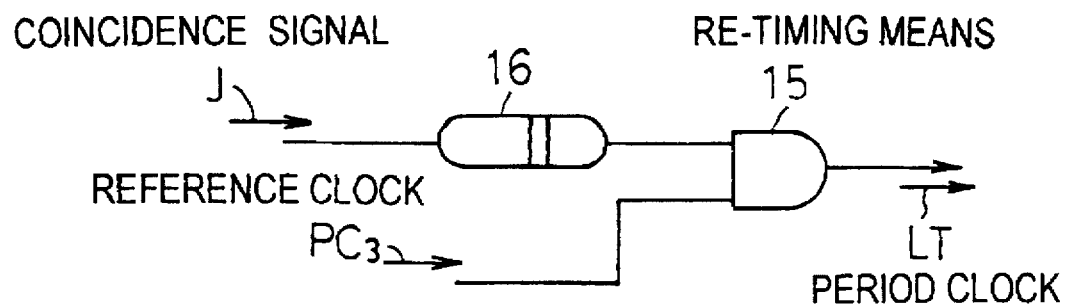
FIG. 8 is a schematic circuit diagram showing an example of the re-timing means used in a period generating device used in the conventional IC tester.
Figure 9:
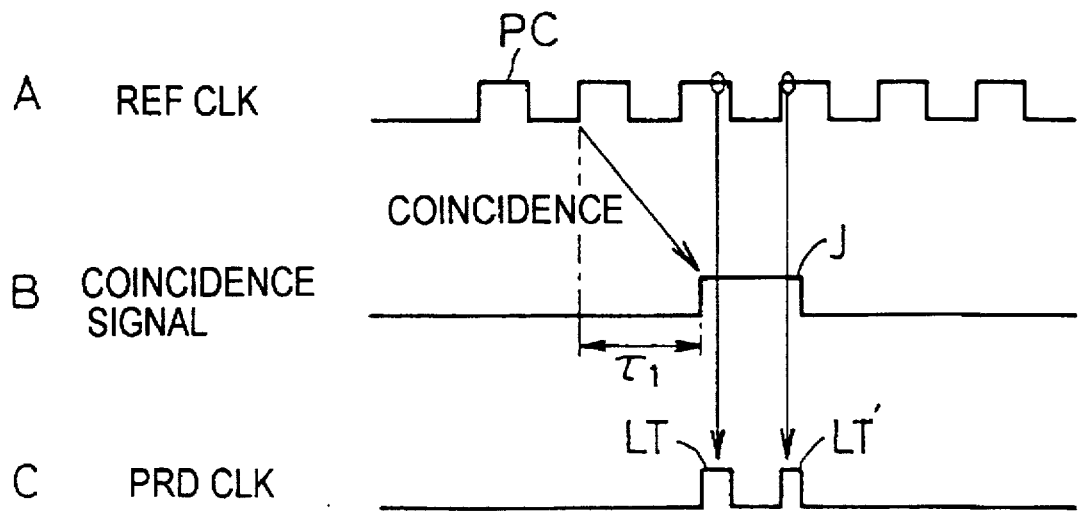
FIG. 9 is waveforms for explaining a drawback of the re-timing means shown in FIG. 8.
Figure 10:
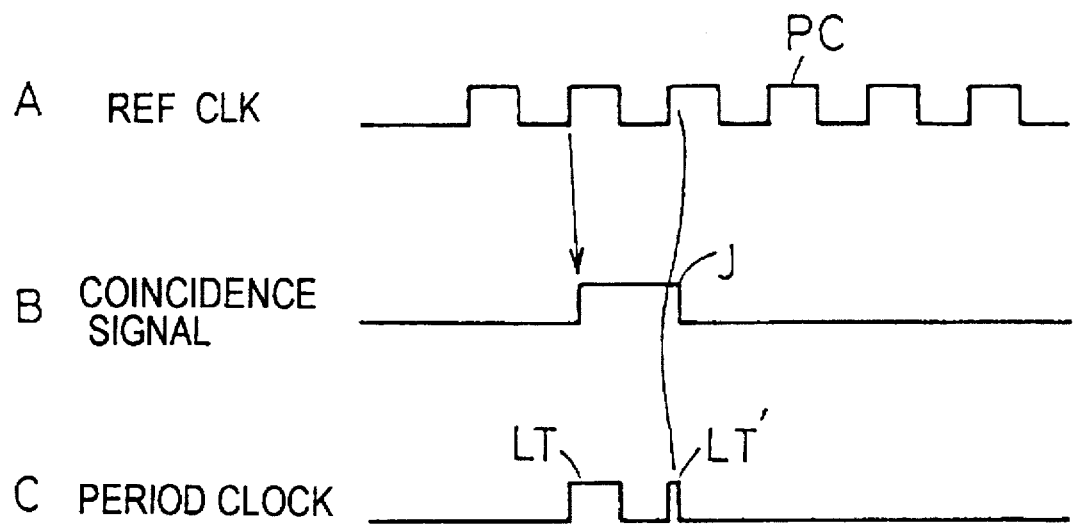
FIG. 10 is waveforms for explaining a drawback of the re-timing means shown in FIG. 8 from which a delay element is eliminated.
Figure 11:
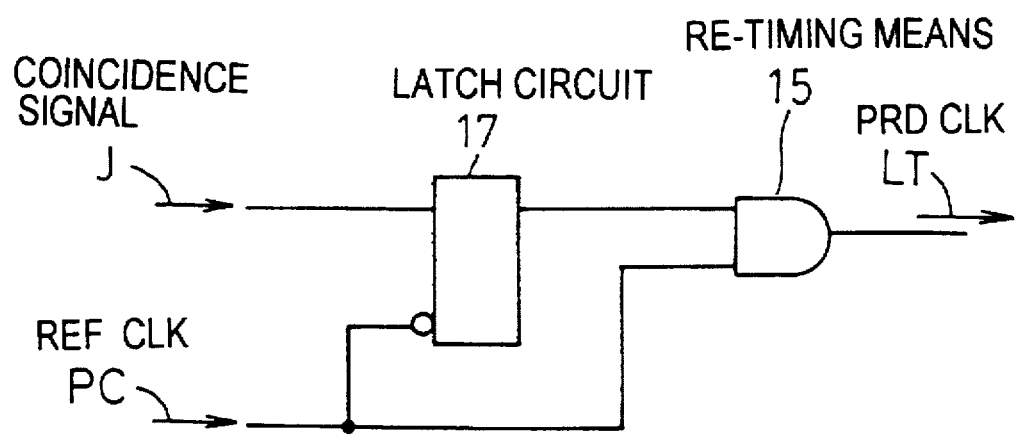
FIG. 11 is a schematic circuit diagram showing another example of the re-timing means used in a period generating device used in the conventional IC tester.

FIG. 3 shows waveforms for explaining the operation of the above-described period generating device 10 according to the present invention. FIG. 3A shows a waveform of the internal reference clock PC of the period generating device 10, FIG. 3B shows a waveform of the coincidence signal J, and FIG. 3C shows a waveform of the output signal from the last stage flio-flop of the shift register 18 in this example. In accordance with the present invention, assuming that the coincidence signal J is outputted at a time point delayed by delay time $\tau_1$ from the timing of the rise of a pulse F among the internal reference clock pulses PC in the period generating device 10, the pulse F coinciding with the period data, shift operations by the shift registers 18 and 19 take place at the timing of the rise of the next reference clock pulse ①, whereby the timing set data TS outputted from the last stage flip-flop of the shift register 18 is updated from #F to #2, for instance. Accordingly, as long as the timing of the rise of the coincidence signal J is at any time point within a range corresponding to nearly one period from a time point immediately after the rise of the reference clock pulse F to a time point immediately before the rise of the immediately subsequent reference clock pulse ①, the input terminal of each switching circuit MUX is switched from A to B if the coincidence signal J assumes a logic "H" level at the timing of the rise of the next pulse ①. Consequently, shift operations by the shift registers 18 and 19 are certainly effected. In addition, since the reference clock PC applied to the trigger input terminal CK of each flip-flop FF cannot be cut or shortened in pulse width, the shift registers 18 and 19 can operate in a stable condition.

As described above, in accordance with the present invention, the period generating device is arranged such that the reference clock PC is applied to at least the shift register 18 provided at the previous stage to the period memory 11, and the respective shift registers operate to shift a signal in response to the reference clock PC only when the coincidence signal J is applied thereto. Accordingly, a reliable operation of each shift register is assured if the phase of the coincidence signal J is close to the phase of the reference clock PC or is delayed by nearly one period. In other words, an allowable limits in the delay of the coincidence signal J can be made broader (nearly doubled as compared with the prior art). As a result, even in case the counter 12 and the coincidence detecting means 13 are formed as an IC of a CMOS structure which gives an increased delay time to a signal propagating therethrough, only the sum of the delay times of the counter 12 and the coincidence detecting means 13 is required to remain in a range of time which is slightly shorter than one period of the reference clock PC, and hence a remarkable advantage is obtained that the period generating device 10 arranged to have the shift registers 18 and 19 can be realized as a circuitry of a CMOS structure.

Further, in the foregoing the present invention has been described with reference to ICs which are a typical example of the semiconductor devices. However, it is needless to say that the present invention is also applicable to a period generating device used in a semiconductor device testing apparatus for testing semiconductor devices other than ICs, and the same function and effects can be obtained. In addition, registers at respective stages constituting a shift register may not be limited to flip-flops.

What is claimed is:

1. A period generating device wherein a period signal having a given period is supplied to a pattern generator to determine the period of a test pattern signal which is applied from said pattern generator to a semiconductor device to be tested, and the period of said period signal is defined by timing set data supplied from said pattern generator, and comprising:

a counter for counting a reference clock;

a period memory which has previously stored a plurality of period data therein, supplied thereto with said timing set data outputted from said pattern generator as an address signal, and for outputting a period data stored at an address which is accessed by said address signal;

coincidence detecting means for comparing a count value of said counter with a period data read out of said period memory and for outputting a coincidence signal upon detection of a coincidence between said count value and said period data; and a shift register having registers as a plurality of stages each having stored therein the timing set data to be supplied to said period memory and constituting a pipeline in which the stored timing set data are sequentially shifted one stage by one stage each time a period signal is generated, said period generating device further comprising:

a plurality of switching means each being provided at the previous stage to each of said registers which constitute said shift register; and means for controlling said plurality of switching means such that said switching means are switched to a condition that the timing set data stored in the previous stage register to each switching means is transferred to the subsequent stage register in synchronism with the reference clock when said coincidence detecting means outputs a coincidence signal, and to a condition that the timing set data stored in each switching means is fed back to the input terminal of each switching means in synchronism with the reference clock when the coincidence signal is not outputted, whereby the timing set data stored in each register is maintained therein under the condition that the coincidence signal is not outputted.

2. A period generating device according to claim 1 wherein:

said plurality of registers constituting said shift register are D-type flip-flops, respectively;

each of said switching means is a multiplexer having two input terminals, an output terminal and a control terminal, each of said multiplexers being arranged such that one of the input terminals is connected to the output terminal when the coincidence terminal is not supplied to the control terminal, and the other input terminal is connected to the output terminal when the coincidence signal is supplied to the control terminal;

each of said flip-flops has a trigger terminal supplied with the reference clock, an input terminal connected to the output terminal of the previous stage multiplexer, and an output terminal connected to one input terminal of the previous stage multiplexer and to the other input terminal of the subsequent stage multiplexer; and the timing set data is inputted to the other input terminal of the first stage multiplexer, and the timing set data is outputted to said period memory from the output terminal of the last stage flip-flop.

3. A period generating device according to claim 1 wherein a second shift register is provided at the subsequent stage to said period memory, said second shift register having registers as a plurality of stages each storing therein the period data read out of said period memory and constituting a pipeline in which the read-out period data are sequentially shifted one stage by one stage, and further comprising:

a plurality of switching means each being provided at the previous stage to each of said registers constituting said second shift register; and means for controlling said plurality of switching means such that said switching means are switched to a condition that the period data stored in the previous stage register to each switching means is transferred to the subsequent stage register in synchronism with the reference clock when said coincidence detecting means outputs a coincidence signal, and to a condition that the period data stored in each switching means is fed back to the input terminal of each switching means in synchronism with the reference clock when the coincidence signal is not outputted, whereby the period data stored in each register is maintained therein under the condition that the coincidence signal is not outputted.

4. A period generating device according to claim 3 wherein:

said plurality of registers constituting said second shift register are D-type flip-flops, respectively;

each of said switching means provided at the previous stage to each of said registers is a multiplexer having two input terminals, an output terminal and a control terminal, each of said multiplexers being arranged such that one of the input terminals is connected to the output terminal when the coincidence terminal is not supplied to the control terminal, and the other input terminal is connected to the output terminal when the coincidence signal is supplied to the control terminal;

each of said flip-flops has a trigger terminal supplied with the reference clock, an input terminal connected to the output terminal of the previous stage multiplexer, and an output terminal connected to one input terminal of the previous stage multiplexer and to the other input terminal of the subsequent stage multiplexer; and the period data is inputted to the other input terminal of the first stage multiplexer, and the period data is outputted to said period memory from the output terminal of the last stage flip-flop.

* * * * *